(12) United States Patent
Luo

(10) Patent No.: US 12,081,191 B2
(45) Date of Patent: Sep. 3, 2024

(54) PACKAGING METHOD OF A FILM BULK ACOUSTIC RESONATOR

(71) Applicant: Ningbo Semiconductor International Corporation (Shanghai Branch), Shanghai (CN)

(72) Inventor: Hailong Luo, Ningbo (CN)

(73) Assignee: Ningbo Semiconductor International Corporation (Shanghai Branch), Shanghai (CN)

( * ) Notice: Subject to any disclaimer, the term of this patent is extended or adjusted under 35 U.S.C. 154(b) by 752 days.

(21) Appl. No.: 17/196,607

(22) Filed: Mar. 9, 2021

(65) Prior Publication Data
US 2021/0242855 A1  Aug. 5, 2021

Related U.S. Application Data

(63) Continuation of application No. PCT/CN2019/107173, filed on Sep. 23, 2019.

(30) Foreign Application Priority Data

Jul. 19, 2019 (CN) .......................... 201910657416.3

(51) Int. Cl.
| | |
|---|---|
| H03H 3/02 | (2006.01) |
| H03H 9/10 | (2006.01) |
| H03H 9/17 | (2006.01) |

(52) U.S. Cl.
CPC ............ *H03H 9/1035* (2013.01); *H03H 3/02* (2013.01); *H03H 9/173* (2013.01); *H03H 2003/021* (2013.01)

(58) Field of Classification Search
CPC ........ H03H 9/1035; H03H 3/02; H03H 3/173; H03H 9/1007; H03H 9/0504; Y10T 29/42; Y10T 29/59005
See application file for complete search history.

(56) References Cited

U.S. PATENT DOCUMENTS

| 8,303,755 B2 | 11/2012 | Ichikawa et al. |
| 11,245,383 B2 * | 2/2022 | Hurwitz ............... H03H 9/1014 |

(Continued)

FOREIGN PATENT DOCUMENTS

| CN | 105405816 A | 3/2016 |
| CN | 109586680 A | 4/2019 |

(Continued)

*Primary Examiner* — Donghai D Nguyen
(74) *Attorney, Agent, or Firm* — Anova Law Group, PLLC

(57) ABSTRACT

A packaging method and a packaging structure of a film bulk acoustic resonator are provided. The packaging method includes: providing a resonant cavity main structure including a first substrate and a film bulk acoustic resonant structure having a first cavity formed therebetween; forming a resonator cover by providing a second substrate and forming an elastic bonding material layer containing a second cavity and an initial opening; bonding the resonant cavity main structure and the resonator cover together through the elastic bonding material layer and removing elasticity of the elastic bonding material layer, where the second cavity is at least partially aligned with the first cavity; forming a through-hole containing the initial opening and a hole connected with the initial opening and passing through the resonator cover; and forming a conductive interconnection layer covering a sidewall of the through-hole and a portion of a surface of the resonator cover.

14 Claims, 3 Drawing Sheets

(56) References Cited

U.S. PATENT DOCUMENTS

| | | | |
|---|---|---|---|
| 11,870,410 B2* | 1/2024 | Luo | H03H 9/174 |
| 2002/0121337 A1* | 9/2002 | Whatmore | H03H 9/105 |
| | | | 156/292 |
| 2008/0283944 A1 | 11/2008 | Geefay | |
| 2009/0134957 A1 | 5/2009 | Shin | |
| 2010/0301703 A1 | 12/2010 | Chen et al. | |
| 2018/0183406 A1 | 6/2018 | Patil et al. | |

FOREIGN PATENT DOCUMENTS

| | | |
|---|---|---|
| JP | 2005094728 A | 4/2005 |
| JP | 2006173557 A | 6/2006 |

* cited by examiner

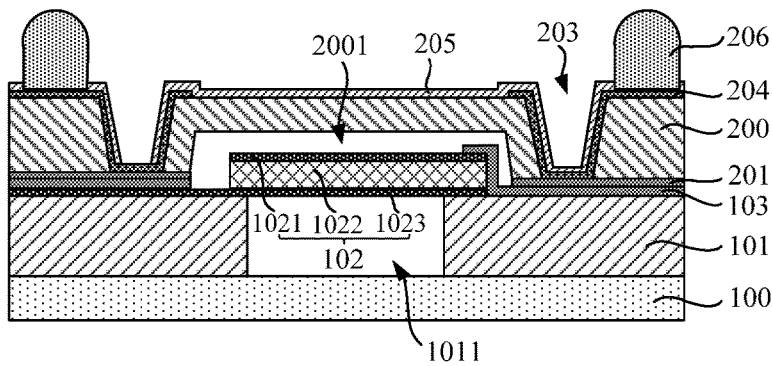

Figure 1

| Providing a resonant cavity main structure, where the resonant cavity main structure may include a first substrate and a film bulk acoustic resonant structure formed on the first substrate, and a first cavity may be formed between the first substrate and the film bulk acoustic resonant structure | S1 |

| Providing a second substrate, and forming an elastic bonding material layer on the second substrate to form a resonator cover, and the elastic bonding material layer may include a second cavity and an initial opening on the periphery of the second cavity | S2 |

| Bonding the resonant cavity main structure and the resonator cover together through the elastic bonding material layer and removing elasticity of the elastic bonding material layer, where after the bonding process, the film bulk acoustic resonant structure may be sandwiched between the first substrate and the second substrate, the second cavity and the first cavity may be at least partially aligned, and the initial opening may expose an electrical connection part corresponding to the film bulk acoustic resonant structure | S3 |

| Forming a through-hole containing the initial opening and a hole connected with the initial opening and passing through the resonator cover | S4 |

| Forming a conductive interconnection layer, where the conductive interconnection layer may cover the sidewall surface of the through-hole and a portion of the surface of the resonator cover on the periphery of the through-hole | S5 |

| Forming a patterned passivation layer, where the patterned passivation layer may fully fill the through-hole and may expose a portion of the conductive interconnection layer on the surface of the resonator cover on the periphery of the through-hole, and the exposed conductive interconnection layer may form a conductive contact pad | S6 |

Figure 2

PACKAGING METHOD OF A FILM BULK ACOUSTIC RESONATOR

CROSS-REFERENCE TO RELATED APPLICATIONS

This application is a continuation application of PCT Patent Application No. PCT/CN2019/107173, filed on Sep. 23, 2019, which claims priority to Chinese patent application No. 201910657416.3, filed on Jul. 19, 2019, the entirety of all of which is incorporated herein by reference.

FIELD OF THE DISCLOSURE

The present disclosure generally relates to the field of RF product packaging technology and, more particularly, relates to a packaging method and a packaging structure of a film bulk acoustic resonator.

BACKGROUND

A film bulk acoustic resonator (FBAR) includes electrodes that are typically disposed above and/or below a piezoelectric layer. In response to a high frequency signal applied to the electrode, the piezoelectric layer can oscillate. FBAR can be used in a wireless signal transmission system to achieve input and/or output of a wireless data. For example, FBAR can be used in a wireless communication device, a wireless power transmitter, a filter of a wireless sensor, a transmitter, a receiver, a duplexer, etc.

Referring to FIG. 1, a current packaging process of a film bulk acoustic resonator often includes following steps.

(1) A silicon dioxide layer 200 is grown on a carrier substrate (not illustrated) through a thermal oxidation process or a chemical vapor deposition process, and then a portion of the silicon dioxide layer 200 along a thickness direction is removed through photolithography and etching processes, to form a second cavity 2001.

(2) Through an Au—Au bonding process, the carrier substrate having the second cavity 2001 is bonded with a pre-fabricated resonant cavity main structure with a first cavity 1011, a film bulk acoustic resonant structure 102 and a first substrate 100. In view of this, the second cavity 2001 is aligned with the first cavity 1011, and the film bulk acoustic resonant structure 102 is sandwiched between the second cavity 2001 (also referred to an upper cavity) and the first cavity 1011 (also referred to a lower cavity). A lower cavity wall 101 is often formed on the pre-fabricated first substrate 100. The film bulk acoustic resonant structure 102 includes a first electrode 1021 (also referred to a lower electrode), a piezoelectric layer 1022 and a second electrode 1023 (also referred to an upper electrode) that are sequentially stacked over the first cavity. The lower cavity wall 101 is configured to form the first cavity 1011 between the first substrate 100 and the second electrode 1023.

Specifically, the Au—Au bonding process includes first forming a gold layer 201 required for bonding on the silicon dioxide layer 200 around the second cavity 2001 through a metal lift-off technology, and forming a gold layer 103 required for bonding on the first electrode 1021 and the second electrode 1023 around the first cavity 1011; and then, after the first cavity 1011 and the second cavity 2001 are aligned with each other, the gold layer 201 and the gold layer 103 may be melt by heating to form the Au—Au bonding. The metal lift-off process refers to that after coating a photoresist film on a substrate and exposing and developing the photoresist film, the photoresist film with a certain pattern is used as a mask, metal is evaporated on the substrate with the photoresist film, then while removing the photoresist film, the metal on the photoresist film is peeled off, thereby merely leaving the metal with required pattern on the substrate.

(3) Using a backside-thinning process, the carrier substrate in the bonded structure is removed, such that the remaining silicon dioxide layer 200 serves as a cover plate, and a hole 203 exposing the bonded gold surface is formed by punching a hole in the silicon dioxide layer 200.

(4) A copper metal layer 204 is electroplated on the surface of the silicon dioxide layer 200 and sidewall of the hole 203, and the copper metal layer 204 is patterned through processes such as photolithography, etching, etc., to form wires for leading out the second electrode 1023 and the first electrode 1021.

(5) A passivation layer 205 is deposited over the silicon dioxide layer 200 and the copper metal layer 204, and the passivation layer 205 is patterned through processes such as photolithography, etching, etc., to expose a portion of the copper metal layer 204 as a metal pad. Further, a ball is soldered at the exposed copper metal layer 204, such that the formed solder ball 206 is in contact with the metal pad.

In the above-mentioned packaging process of the film bulk acoustic resonator, the silicon dioxide layer needs to be deposited and etched on the carrier substrate, the Au—Au bonding process is needed to bond the first cavity 1011 and the second cavity 2001 together, and the carrier substrate needs to be removed after bonding, such that the process is complicated and the equipment cost is high. Moreover, the Au—Au bonding process introduces the gold element, which causes a high material cost and element pollution to the production line. In addition, the passivation layer 205 in the above process is often formed by depositing a substantially thin layer of silicon oxide, silicon nitride, or any other commonly used passivation layer material, which causes a gap in the hole 203, and causes the sidewall of the second cavity 2001 to be substantially thin. Therefore, the mechanical strength of the upper cavity cover is insufficient, which will cause device reliability risk.

The disclosed packaging method and packaging structure of a film bulk acoustic resonator are directed to solve one or more problems set forth above and other problems in the art.

BRIEF SUMMARY OF THE DISCLOSURE

One aspect of the present disclosure provides a packaging method of a film bulk acoustic resonator. The packaging method includes providing a resonant cavity main structure. The resonant cavity main structure includes a first substrate and a film bulk acoustic resonant structure formed on the first substrate, and a first cavity is formed between the first substrate and the film bulk acoustic resonant structure. The packaging method also includes forming a resonator cover by providing a second substrate and forming an elastic bonding material layer on the second substrate. The elastic bonding material layer contains a second cavity and an initial opening on a periphery of the second cavity. In addition, the packaging method includes bonding the resonant cavity main structure and the resonator cover together through the elastic bonding material layer and removing elasticity of the elastic bonding material layer. After the bonding process, the film bulk acoustic resonant structure is sandwiched between the first substrate and the second substrate, the second cavity is at least partially aligned with the first cavity, and the initial opening exposes a corresponding electrical connection part of the film bulk acoustic resonant structure. Moreover, the packaging method includes forming a through-hole containing the initial opening and a hole connected with the initial opening and passing through the resonator cover. Further, the packaging method includes forming a conductive interconnection layer. The conductive interconnection layer covers a sidewall of the through-hole and a portion of a surface of the resonator cover on a periphery of the through-hole.

Another aspect of the present disclosure provides a packaging structure of a film bulk acoustic resonator. The packaging structure includes a resonant cavity main structure. The resonant cavity main structure includes a first substrate and a film bulk acoustic resonant structure formed on the first substrate, and a first cavity is formed between the first substrate and the film bulk acoustic resonant structure. The packaging structure also includes a resonator cover. The resonator cover includes a second substrate and an elastic bonding material layer that has lost elasticity. The elastic bonding material layer is sandwiched between the second substrate and the film bulk acoustic resonant structure, and the elastic bonding material layer contains a second cavity and an initial opening on a periphery of the second cavity. The second cavity is at least partially aligned with the first cavity, and the initial opening exposes a corresponding electrical connection part of the film bulk acoustic resonant structure. In addition, the packaging structure includes a through-hole containing the initial opening formed in the resonator cover. The through-hole penetrates through the resonator cover, and a portion of the through-hole in the second substrate is connected with the initial opening. Further, the packaging structure includes a conductive interconnection layer. The conductive interconnection layer covers a sidewall of the through-hole and a portion of a surface of the resonator cover on a periphery of the through-hole.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 1 illustrates a schematic cross-sectional view of a typical packaging structure of a film bulk acoustic resonator;

FIG. 2 illustrates a flowchart of an exemplary packaging method of a film bulk acoustic resonator consistent with various disclosed embodiments of the present disclosure.

DETAILED DESCRIPTION

Reference will now be made in detail to exemplary embodiments of the disclosure, which are illustrated in the accompanying drawings. However, those skilled in the art may easily understand that the present disclosure may be implemented without one or more of these details. In certain examples, some well-known technical features in the art are not described herein to avoid confusion with the present disclosure. Wherever possible, the same reference numbers will be used throughout the drawings to refer to the same or the alike parts.

Referring to FIG. 2, the present disclosure provides a packaging method of a film bulk acoustic resonator. The packaging method may include following steps.

In S1: providing a resonant cavity main structure. The resonant cavity main structure may include a first substrate and a film bulk acoustic resonant structure formed on the first substrate. A first cavity may be formed between the first substrate and the film bulk acoustic resonant structure.

In S2: providing a second substrate, and forming an elastic bonding material layer on the second substrate to form a resonator cover. The elastic bonding material layer may include a second cavity and an initial opening on the periphery of the second cavity.

In S3: bonding the resonant cavity main structure and the resonator cover together through the elastic bonding material layer and removing the elasticity of the bonding material layer. After the bonding process, the film bulk acoustic resonant structure may be sandwiched between the first substrate and the second substrate. The second cavity and the first cavity may be at least partially aligned, and the initial opening may expose an electrical connection part corresponding to the film bulk acoustic resonant structure.

In S4: forming a through-hole containing the initial opening and a hole connected with the initial opening and passing through the resonator cover.

In S5: forming a conductive interconnection layer. The conductive interconnection layer may cover the sidewall surface of the through-hole and a portion of the surface of the resonator cover on the periphery of the through-hole.

In S6: forming a patterned passivation layer. The patterned passivation layer may fully fill the through-hole and may expose a portion of the conductive interconnection layer on the surface of the resonator cover on the periphery of the through-hole. The exposed conductive interconnection layer may form a conductive contact pad.

Figure 3A:
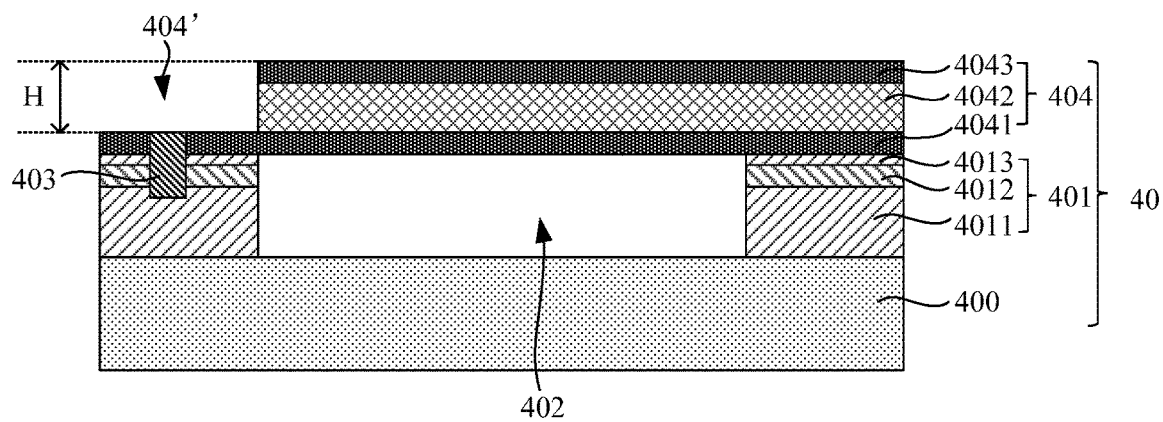
FIGS. 3A-3E illustrate schematic cross-sectional views of semiconductor structures corresponding to certain stages for packaging an exemplary film bulk acoustic resonator consistent with various disclosed embodiments of the present disclosure.

Referring to FIG. 3A, in S1, a first substrate 400 may be provided, and a first cavity 402 and a film bulk acoustic resonant structure 404 may be formed on the first substrate 400 to form a resonant cavity main structure 40.

In specific implementation, forming the resonant cavity main structure 40 may include following.

A carrier substrate may be first provided, and an etching stop layer (not illustrated) may be formed on the carrier substrate. The carrier substrate may be any suitable substrate, e.g., a bare silicon chip, a ceramic substrate, a quartz or glass substrate, etc. The etching stop layer may be formed on the carrier substrate by a suitable deposition method (e.g., chemical vapor deposition, physical vapor deposition, or atomic layer deposition) or a thermal oxidation method. The etching stop layer may be made of a material including but not limited to at least one of silicon oxide, silicon nitride, silicon oxynitride, fluorocarbon (CF), carbon-doped silicon oxide (SiOC), and silicon carbonitride. The etching stop layer may serve as a process stopping point when subsequently removing the carrier substrate, to protect the film bulk acoustic resonant structure. In one embodiment, a thickness of the etching stop layer may be in a range of approximately 1000 Å-10000 Å. In certain embodiments, the etching stop layer may be a removable film material such as light-curing adhesive or hot-melt adhesive, which may be simultaneously removed while subsequently removing the carrier substrate.

Then, a second electrode material layer (not illustrated) for forming a second electrode 4043, a piezoelectric material layer for forming a piezoelectric layer 4042, and a first electrode material layer for forming a first electrode 4041 may be sequentially formed on the surface of the etching stop layer by any suitable method such as evaporation, magnetron sputtering, etc., to form the film layers for forming the film bulk acoustic resonant structure 404. The first electrode material layer and the second electrode material layer may be made of a material including but not limited to at least one of Ag, Au, Cu, Pd, Cr, Mo, Ti, Ta, Sn, W, and Al. The piezoelectric layer 4042 may be made of a piezoelectric material with wurtzite crystal structure such as ZnO, AlN, GaN, lead zirconate titanate, lead titanate, etc.

A thickness of the piezoelectric material layer may be determined according to a target resonance frequency. In one embodiment, the thickness of the piezoelectric material layer may be set to be approximately ½ of the wavelength. In one embodiment, the Mo metal film may be used as the first electrode material layer and the second electrode material layer. A thickness of the Mo metal film may often be in a range of approximately 2000 Å-1 μm. The AlN may be used as the piezoelectric material layer, and a thickness of AlN may often be in a range of approximately 2000 Å-2 μm. In certain embodiments, the to-be-formed film layers of the film bulk acoustic resonant structure may also include any other film layer in addition to the above-mentioned film layers, which may be reasonably set according to actual device requirements, and may not be limited herein.

Then, a third lower cavity wall layer 4013 and a second lower cavity wall layer 4012 may be sequentially formed over the first electrode material layer by a suitable deposition method (such as chemical vapor deposition, physical vapor deposition or atomic layer deposition, etc.) or a thermal oxidation process. The third lower cavity wall layer 4013 may be made of silicon oxide, and the second lower cavity wall layer 4012 may be made of silicon nitride or silicon oxynitride. The third lower cavity wall layer 4013 may serve as an etching stop point when subsequently etching the first lower cavity wall layer 4011 to form the first cavity 402, which may protect the first electrode material layer from unnecessary damage. The second lower cavity wall layer 4012 may serve as a hard mask layer in a subsequent process of aligning a mark opening, which may facilitate to improve the accuracy of the formed alignment mark opening.

Exposure, development, and etching processes may be performed to sequentially etch the second lower cavity wall layer 4012, the third lower cavity wall layer 4013, the first electrode material layer, the piezoelectric material layer, and the second electrode material layer, and the etching may stop at the surface of the carrier substrate. If the etching stop layer is formed on the surface of the carrier substrate, the etching may stop at the etching stop layer on the surface of the carrier substrate, thereby forming a corresponding alignment mark opening (not illustrated). A cross-sectional plane (a plane parallel to the surface of the carrier substrate) of the alignment mark opening may have a circular shape, a cross shape, an elliptical shape, a polygonal shape, or a grating shape, etc. A longitudinal-sectional plane (a plane perpendicular to the surface of the carrier substrate) of the alignment mark opening may have a rectangular shape, a U shape, a regular trapezoid shape, or an inverted trapezoid shape, etc. The alignment mark opening may often be set on the periphery of a to-be-formed first cavity 402, e.g., on the outside of the contact area of the first electrode and the contact area of the second electrode of the film bulk acoustic resonator. In a specific implementation, the alignment mask opening may be merely formed on one outside of the to-be-formed film bulk acoustic resonator, or may be formed on both outsides of the film bulk acoustic resonator in an axisymmetric or a center-symmetric manner.

Through a suitable deposition method (such as chemical vapor deposition, physical vapor deposition, or atomic layer deposition, etc.), a first lower cavity wall layer 4011 may be formed to fill the alignment mark opening and to cover the second lower cavity wall layer 4012. The formed first lower cavity wall layer 4011 may not only fully fill the alignment mark opening, but also need to have a sufficient thickness above the second lower cavity wall layer 4012 for subsequently forming a first cavity 402 with a required depth. In one embodiment, the first lower cavity wall layer 4011 may be made of silicon oxide, tetraethyl orthosilicate (TEOS), or poly-2-ethyl-2-oxazoline (PEOX) etc., and may have a thickness in a range of approximately 0.5 μm-4 μm. After forming the first lower cavity wall layer 4011, the top of the first lower cavity wall layer 4011 may be planarized by a chemical mechanical polishing process. Therefore, on the one hand, the process accuracy of the subsequently formed first cavity and the uniformity of the depth of the formed first cavity may be improved; and on the other hand, the subsequent bonding of the first substrate 400 may be facilitated. Referring to FIG. 3A, a portion of the first lower cavity wall layer 4011 fully filled in the alignment mark opening may form an alignment mark 403. The alignment mark may be configured for subsequent alignment of the second substrate 300 and the first substrate 400 to improve alignment accuracy. The first lower cavity wall layer 4011, the second lower cavity wall layer 4012, and the third lower cavity wall layer 4013 may constitute a supporting layer for forming the first cavity 402.

Then, exposure, development, and etching processes may be performed to etch the first lower cavity wall layer 4011, the second lower cavity wall layer 4012, and the third lower cavity wall layer 4013 to form the first cavity 402. The first lower cavity wall layer 4011, the second lower cavity wall layer 4012, and the third lower cavity wall layer 4013 may together serve as the lower cavity wall surrounding the first cavity 402. The cross-section (a cross-section parallel to the surface of the carrier substrate) of the first cavity 402 may have a polygon shape such as a rectangle shape or a pentagon shape, or may have a circle shape, an ellipse shape, etc. When a plurality of film bulk acoustic resonators need to be formed on a same substrate, a plurality of first cavities 402 may be formed at the same time, and adjacent first cavities 402 may be isolated by the remaining stacked structure of the first lower cavity wall layer 4011, the second lower cavity wall layer 4012, and the third lower cavity wall layer 4013. The remaining first lower cavity wall layer 4011, the second lower cavity wall layer 4012, and the third lower cavity wall layer 4013 around the first cavity 402 may subsequently serve as the supporting structure for supporting the film bulk acoustic resonant structure. The first lower cavity wall layer 4011, the second lower cavity wall layer 4012, and the third lower cavity wall layer 4013 may constitute an ONO (oxide layer-silicon nitride-oxide layer) structure, and the stacked ONO structure may have substantially low defects. The second lower cavity wall layer 4012 made of silicon nitride may trap charges and suppress leakage current. A depth of the first cavity 402 may be in a range of approximately 0.5 μm-4 μm.

Then, a first substrate 400 may be provided. The first substrate 400 may be made of any suitable carrier material known to those skilled in the art. In one embodiment, the first substrate 400 may be made of at least one of Si, Ge, SiGe, SiC, SiGeC, InAs, GaAs, InP, any other III/V compound semiconductor, and a multilayer structure formed by such semiconductors. In another embodiment, the first substrate 400 may be a silicon-on-insulator (SOI) substrate, a stacked-silicon-on-insulator (SSOI) substrate, a stacked-SiGe-on-insulator (S-SiGeOI) substrate, a SiGe-on-insulator (SiGeOI) substrate, a germanium-on-insulator (GeOI) substrate, or a double-side polished silicon wafer (DSP). In certain embodiments, the first substrate may be a ceramic substrate such as an alumina substrate, a quartz substrate, or a glass substrate, etc.

Then, the first substrate 400 may be bonded to the first lower cavity wall layer 4011 by any suitable bonding process known to those skilled in the art. In one embodiment, by coating the first substrate 400 with hot melt adhesive, a side of the first lower cavity wall layer 4011 facing away from the carrier substrate may be bonded to the first substrate 400. Therefore, the first cavity 402 may be enclosed between the first substrate 400 and the first electrode material layer configured to form the first electrode 4041. In another embodiment, the first substrate 400 may be bonded to the first lower cavity wall layer 4011 by vacuum bonding. The conditions of the vacuum bonding process may include a bonding pressure in a range of approximately 1 Pa-$10^5$ Pa and a bonding temperature in a range of approximately 150° C.-200° C.

Then, according to the material characteristics of the carrier substrate, the carrier substrate may be removed by a suitable process. For example, when the carrier substrate is a bare silicon wafer, the carrier substrate may be removed by a CMP process or a CMP process combined with a wet etching process.

Then, the entire structure may be inverted, such that the first substrate 400 may be at the bottom, and the second electrode material layer configured to form the second electrode 4043 may be at the top. The first electrode material layer, the piezoelectric material layer and the second electrode material layer may be sequentially patterned through exposure, development, and etching processes, to form the first electrode 4041 (i.e., the remaining first electrode material layer, also referred to the lower electrode), the piezoelectric layer 4042 (i.e., the remaining piezoelectric material layer), and the second electrode 4042 (i.e., the remaining second electrode material layer, also referred to the upper electrode), thereby forming film bulk acoustic resonant structure 404.

In such process, a portion of the second electrode material layer, a portion of the piezoelectric material layer under the second electrode material layer, and a portion of the alignment mark 403 along a thickness direction in the film bulk acoustic resonant structure 404 on the outer side of the first cavity 402 may be removed by etching at the same time, to expose the first electrode 4041, thereby forming an opening 404'. A top-view shape of the opening 404' may be semi-annular or closed-loop, such that a stepped film bulk acoustic resonant structure 404 may be formed on the periphery of the first cavity 402, and the step height may be uniform and may be marked as H. In certain embodiments, before forming the third lower cavity wall layer 4013 on the film layer configured to form the film bulk acoustic resonant structure 404, the film layer configured to form the film bulk acoustic resonant structure 404 may be patterned to form the film bulk acoustic resonant structure 404.

Therefore, the process of providing the resonant cavity main structure 40 in S1 may be completed.

In certain embodiments, instead of using a carrier substrate, a sacrificial layer may be used to directly form the first cavity 402 and the film bulk acoustic resonant structure 404 on the first substrate 400, to obtain the resonant cavity main structure 40. The specific process may include following.

First, a portion of a partial region of the first substrate 400 along a thickness direction may be removed by etching to form a groove (not illustrated) for forming the first cavity 402. The first substrate 400 may include a base (not illustrated) and at least one thin film (not illustrated) covering the base (not illustrated). Alternatively, the first substrate 400 may be a bare chip made of semiconductor material.

Then, the groove may be filled with a sacrificial layer (not illustrated). The top surface of the sacrificial layer may be coplanar with the top surface of the lower cavity wall 401, or may be above the top surface of the lower cavity wall 401, or may be slightly below the top surface of the lower cavity wall 401. The sacrificial layer may include a single-layer structure or a stacked structure.

Then, the top surfaces of the first substrate 400 and the sacrificial layer may be sequentially covered with a first electrode material layer (not illustrated) for forming the first electrode 4041, a piezoelectric material layer for forming the piezoelectric layer 4042, and the second electrode material layer for forming the second electrode 4043. Through exposure, development, and etching processes, the first electrode material layer, the piezoelectric material layer, and the second electrode material layer may be sequentially patterned, or the second electrode material layer, the piezoelectric material layer, and the first electrode material layer may be sequentially patterned, to form the first electrode 4041, the piezoelectric layer 4042, and the second electrode 4043, thereby forming the film bulk acoustic resonant structure 404.

Then, a release hole (not illustrated) may be formed in the film bulk acoustic resonant structure 404 in the region of the first cavity 402 and near the edge thereof. The sacrificial layer may be removed by introducing an etchant into the release hole to re-empty the groove. Therefore, the first cavity 402 between the film bulk acoustic resonant structure 404 and the first substrate 400 may be obtained. The first cavity 402 may have a groove structure with the entire bottom recessed in the first substrate 400. Therefore, the process of providing the resonant cavity main structure 40 in S1 may be completed.

In certain embodiments, another method of using a sacrificial layer to directly form the first cavity 402 and the film bulk acoustic resonant structure 404 on the first substrate 400 to obtain the resonant cavity main structure 40 may be provided. The specific process may include following.

First, a sacrificial layer (not illustrated) may fully cover the first substrate 400. The sacrificial layer may have a single-layer structure or a stacked-layer structure.

Then, through exposure, development, and etching processes, the sacrificial layer may be patterned to form a patterned sacrificial layer for forming the first cavity 402.

Then, the top surfaces of the first substrate 400 and the sacrificial layer may be sequentially covered with a first electrode material layer (not illustrated) for forming the first electrode 4041, a piezoelectric material layer for forming the piezoelectric layer 4042, and the second electrode material layer for forming the second electrode 4043. Through exposure, development, and etching processes, the first electrode material layer, the piezoelectric material layer, and the second electrode material layer may be sequentially patterned, or the second electrode material layer, the piezoelectric material layer, and the first electrode material layer may be sequentially patterned, to form the first electrode 4041, the piezoelectric layer 4042, and the second electrode 4043, thereby forming the film bulk acoustic resonant structure 404.

Then, a release hole (not illustrated) may be formed near the edge of the film bulk acoustic resonant structure 404. The sacrificial layer may be removed by introducing an etchant into the release hole to form the first cavity 402 between the film bulk acoustic resonant structure 404 and the first substrate 400. The first cavity 402 may be protruded on the first substrate 400. Therefore, the process of providing the resonant cavity main structure 40 in S1 may be completed.

In addition, when the first substrate 400 is a wafer, the quantity of film bulk acoustic resonant structures 404 over the first substrate 400 may not be limited to one. In other words, a plurality of film bulk acoustic resonant structures 404 may be simultaneously formed over the first substrate 400, and a first cavity 402 may be formed between each film bulk acoustic resonant structure 404 and the first substrate 400. Adjacent first cavities 402 may be isolated by lower cavity wall 401. Adjacent film bulk acoustic resonant structures 404 may be disconnected from each other, or some film layers may be connected together.

Figure 3B:
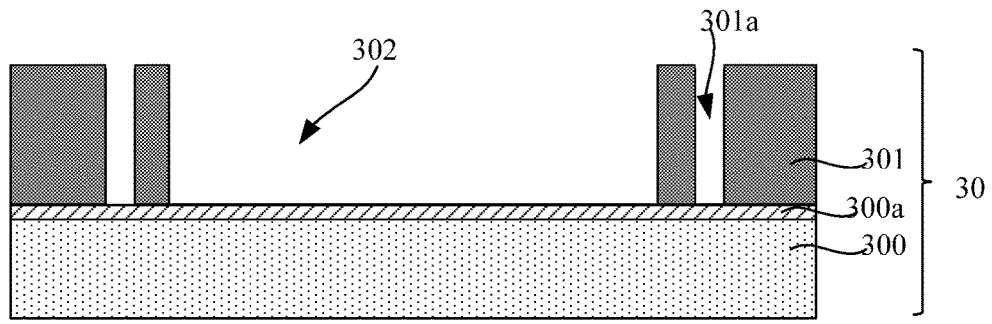
Figure 3C:
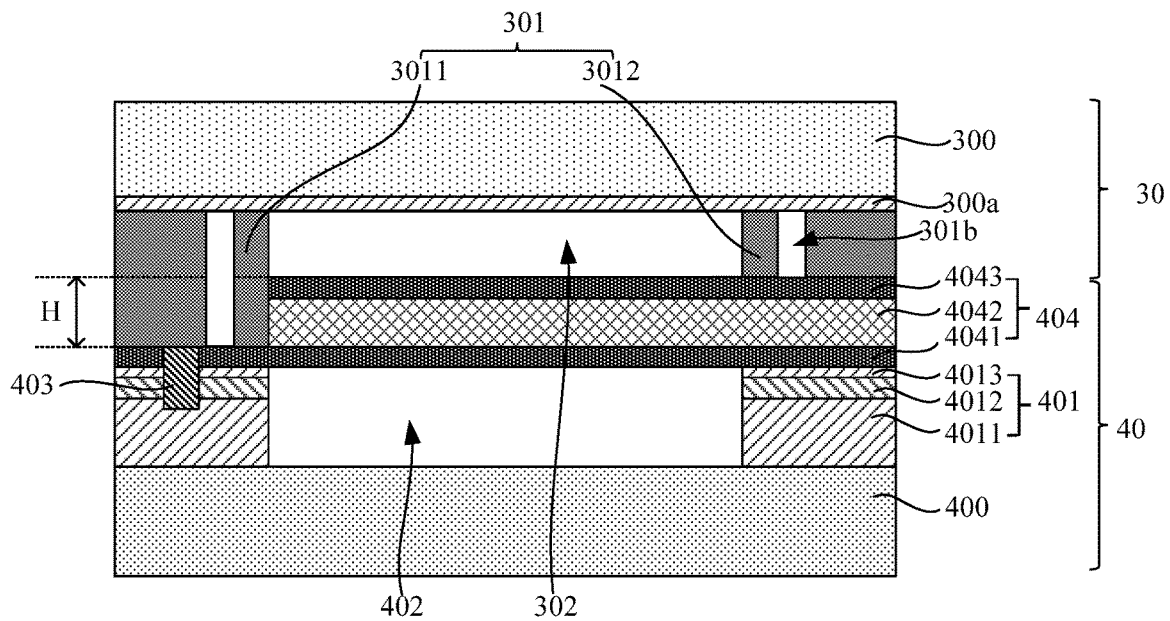

Referring to FIG. 3B and FIG. 3C, in S2, a second substrate 300 may be first provided. The second substrate 300 may be a substrate including a silicon base, such as a bulk silicon substrate, a silicon-on-insulator substrate, or a substrate composed of a silicon base and a silicon dioxide layer stacked on the silicon base (the silicon dioxide layer may be set facing the film bulk acoustic resonant structure), such that a through-hole may be subsequently formed by through-silicon via (TSV) technology. In one embodiment, the second substrate 300 may be a bulk silicon substrate. To control the stopping point of the subsequent process for penetrating through the resonator cover, an etching stop layer 300*a* may be formed to cover the surface of the second substrate 300, and a thickness of the etching stop layer 300*a* may be dependent on the subsequent remaining thickness of the second substrate 300.

Then, an elastic bonding material layer 301 may be formed to cover the etching stop layer 300*a*. The elastic bonding material layer 301 may be made of a material that is capable of being patterned, being cured under certain conditions, stably adhering to the upper and lower layers, and being elastic to tolerate a certain step height difference during subsequent bonding of wafers. Therefore, the elastic bonding material layer 301 may be made of a light-curable material, a heat-curable material, or a combination of the light-curable material and the heat-curable material. Removing the elasticity of the elastic bonding material layer 301 may include a light illumination, or a heating and cooling process, and may become a dry film.

Optionally, the fluidic dry film photoresist material may be coated by a coating process (e.g., spin coating, spray coating, roll coating or screen printing), or a solid or semi-solid dry film material may be pressed by a laminator on the second substrate 300, to form the elastic bonding material layer 301. For example, using a laminator at 80° C.-120° C. (e.g., 110° C.) and in a vacuum condition, the solid dry film material may be attached to the second substrate 300 to form an elastic bonding material. The elastic bonding material may have a three-layer structure, e.g., one layer may be a polyethylene (PE) protective layer, the middle layer may be a dry film layer, and the other layer may be a polyethylene terephthalate (PET) protective layer. The PE protective layer may be a film layer based on special polyethylene (PE) plastic film, such as high-density polyethylene protective film, medium-density polyethylene protective film and low-density polyethylene protective film. The PET protective layer may be obtained by the condensation polymerization of terephthalic acid and ethylene glycol. Both the PE protective layer and the PET protective may merely protect the dry film layer, and may be removed before lamination and development. Therefore, merely the middle layer as the dry film layer may be sandwiched between the second substrate 300 and the first substrate 400. The elastic bonding material may have certain viscosity and desired photosensitivity, and may have a thickness in a range of approximately 10 μm-20 μm.

Then, the elastic bonding material may be patterned to form a second cavity 302 and an initial opening 301*a* through a series of photolithography processes including exposure, development, etc., and a dry etching process. The initial opening 301*a* may be located on the periphery of the second cavity 302 and may not be connected with the second cavity 302. The initial opening 301*a* may have a same depth as the second cavity 302. Both the initial opening 301*a* and the second cavity 302 may penetrate through the elastic bonding material and may reach the surface of the etching stop layer 300*a*. In other words, the initial opening 301*a* may be a through-hole that penetrates through the elastic bonding material, and specific position of the initial opening 301*a* may be depended on the position where the first electrode 4041 and the second electrode 4043 are led out (i.e., the position of the electrical connection part of the film bulk acoustic resonant structure 404).

Specifically, a mask may be first formed on the elastic bonding material, and ultraviolet exposure may be performed under vacuum condition. The process may further include standing for a while after the exposure process. The radiation dose of the ultraviolet exposure may be in a range of approximately 200 mJ/cm$^2$-300 mJ/cm$^2$. Then, at a temperature in a range of approximately 100° C.-150° C. (e.g., 130° C.), the exposed elastic bonding material may be pre-baked for 100 seconds-300 seconds (e.g., 200 seconds). Then, at room temperature, a developer may be sprayed on the pre-baked elastic bonding material several times (e.g., three times), to develop the pre-baked elastic bonding material to form the elastic bonding material layer 301 with a second cavity 302. The developer may be PGMEA, which may contain propylene glycol methyl ether acetate with a formula of $C_6H_{12}O_3$. Therefore, the manufacture of the resonator cover 30 may be completed.

The shape and size of the second cavity 302 may be the same as, or may not be exactly the same as the shape and size of the first cavity 402. As long as the second cavity 302 is capable of after subsequent bonding, enabling the first electrode layer 4041, the piezoelectric layer 4042, and the second electrode layer 4042 of the film bulk acoustic resonant structure 404 to have a portion that is simultaneously overlapped with the first cavity 402 and the second cavity 302, an effective resonant region of the resonator may be formed.

In one embodiment, both the initial opening 301*a* and the second cavity 302 may penetrate through the elastic bonding material layer, and may have a same depth. A portion of the through-hole required configured to form the conductive interconnection layer (i.e., the portion corresponding to the initial opening 301*a*) may be formed in a same process as the second cavity 302. Therefore, on the one hand, the problem that the cured elastic bonding material layer is hard to be etched may be avoided, the process difficulty may be reduced, and time-consuming may be effectively reduced, thereby improving production efficiency. On the other hand, the aspect ratio of the portion of the through-hole formed in a same process as the second cavity 302 and the aspect ratio of a portion of the through-hole subsequently formed in the second substrate may be reduced. Therefore, it may be ensured that both portions of the successively formed through-hole may be effectively etched, which may prevent the issues such as disconnection and short circuit of the subsequently formed conductive interconnection layer due to insufficient etching of the through-hole, may reduce the overall process difficulty of forming the through-hole, and may facilitate to improve the performance of the through-hole and conductive interconnection layer.

In certain embodiments, the depth of the initial opening 301a may be different from the depth of the second cavity 302, and the initial opening 301a may be merely located in a portion of the elastic bonding material layer 301 along a thickness direction. In view of this, the fabrication of the second cavity 302 and the initial opening 301a may be achieved by using two masks in two photolithography combined with etching processes. In addition, when the depth of the initial opening 301a is the same as the depth of the second cavity 302, the fabrication of the second cavity 302 and the initial opening 301a may be achieved by using two masks in two photolithography combined with etching processes. In one embodiment, the second cavity 302 may be first formed in the elastic bonding material, and then the initial opening 301a may be formed in the elastic bonding material. Alternatively, the initial opening 301a may be first formed in the elastic bonding material, and then the second cavity 302 may be formed in the elastic bonding material. In either case, the formed initial opening 301a may be a portion of the subsequently formed through-hole.

In the present disclosure, because the initial opening is first formed (i.e., a portion of the through-hole is first formed), and the second substrate may be subsequently penetrated through to connect with the initial opening to form a full through-hole. Therefore, the difficulty of forming the through-hole may be reduced, the process of forming the through-hole may be prevented from affecting the performance of the resonator, and at the same time, the performance of the formed through-hole and conductive interconnection layer may be ensured.

Referring to FIG. 3C, in S3, the opening of the second cavity 302 may be placed towards the film bulk acoustic resonant structure 404 and may be aligned with the first cavity 402. The second substrate 300 may be bonded with the film bulk acoustic resonant structure 404 and the lower cavity wall 401 through the elastic bonding material layer 301. The film bulk acoustic resonant structure 404 may have an opening 404' exposing a portion or all of the first electrode 4041 (i.e., the first electrical connection part) in the region outside the first cavity 402, and the opening 404' may enable the film bulk acoustic resonant structure 404 to have a step with a height of H. A first through-hole may be subsequently formed in the region of the opening 404'.

Therefore, in one embodiment, the second substrate 300 may be bonded to the resonant cavity main structure 40 by a pressed force. In other words, the second substrate 300 may be bonded to the film bulk acoustic resonant structure 404 and the exposed lower cavity wall 401 through the elastic bonding material layer 301. The thickness of the elastic bonding material layer 301 may be adaptively changed with the step at the opening 404', and at the same time, the surfaces of the second substrate 300 and the first substrate 400 that are opposite to each other may be kept horizontal.

In view of this, the elastic bonding material layer 301 may be divided into two parts to adapt to the difference in step height due to elasticity thereof. A first part may be adhered to the surfaces of the first electrode 4041 and the alignment mark 403 exposed by the opening 404' to form a first upper cavity wall 3011 with a substantially large height, and a second part may be adhered to the surface of the second electrode 4043 opposite to the first upper cavity wall 3011 on the periphery of the first cavity 402, to form a second upper cavity wall 3012 with a substantially small height. The height difference between the surfaces of first upper cavity wall 3011 and the second upper cavity wall 3012 facing the first substrate 400 may be H, and the surfaces of the first upper cavity wall 3011 and the second upper cavity wall 3012 facing the second substrate 300 may be flush or nearly flush. The second substrate 300 may be bonded to the first substrate 400 through the viscosity and molecular bonding of the first upper cavity wall 3011 and the second upper cavity wall 3012.

Such bonding process may be simple, may not affect the performance of the first cavity 402 and the second cavity 302, and may tolerate the film bulk acoustic resonant structure 404 on the first substrate 400 having a certain step height difference in the region around the first cavity 402. Therefore, after the second substrate 300 and the first substrate 400 are bonded together, the problem that the surface of the second substrate facing away from the first substrate is tilted caused by the step height difference may be prevented, and the problem of unreliable bonding caused by the step height difference may be prevented. Optionally, the process conditions for bonding the resonator cover 30 and the resonant cavity main structure 40 may include: a bonding pressure in a range of approximately of 1 Pa-$10^5$ Pa, a vacuum bonding, a temperature in a range of approximately of 150° C.-200° C., and a pressure duration in a range of approximately of 20 min-30 min. Therefore, under the premise of ensuring the bonding performance, the resonance performance of the product may not be affected.

In such process, although the thickness of the elastic bonding material layer 301 varies according to the step height difference of the bonding surface of the resonant cavity main structure 40, the morphology and size of the second cavity 302 and the morphology and diameter of the initial opening 301b having the height adjusted may always be maintained to meet the requirements. After the bonding is achieved, the elastic bonding material layer 301 may be solidified by a light illumination, or a heating and cooling process. Therefore, the bonding material layer 301 may lose elasticity, and the resonator cover 30 and the resonant cavity main structure 40 may be reliably connected together. Curing the elastic bonding material layer 301 may include a high-temperature curing process (i.e., a heating and cooling process), where the curing temperature may be in a range of approximately 180° C.-220° C. (e.g., 190° C.), and the curing duration may be in a range of approximately 1.5 hours-2 hours (e.g., 2 hours). In certain embodiments, curing the elastic bonding material layer 301 may include an ultraviolet curing process, where the radiation dose of ultraviolet curing may be in a range of approximately 200 mJ/cm$^2$-300 mJ/cm$^2$. The ultraviolet exposure process for patterning the elastic bonding material layer 301 may have the same radiation dose, which may simplify the process and reduce the cost.

Figure 3D:
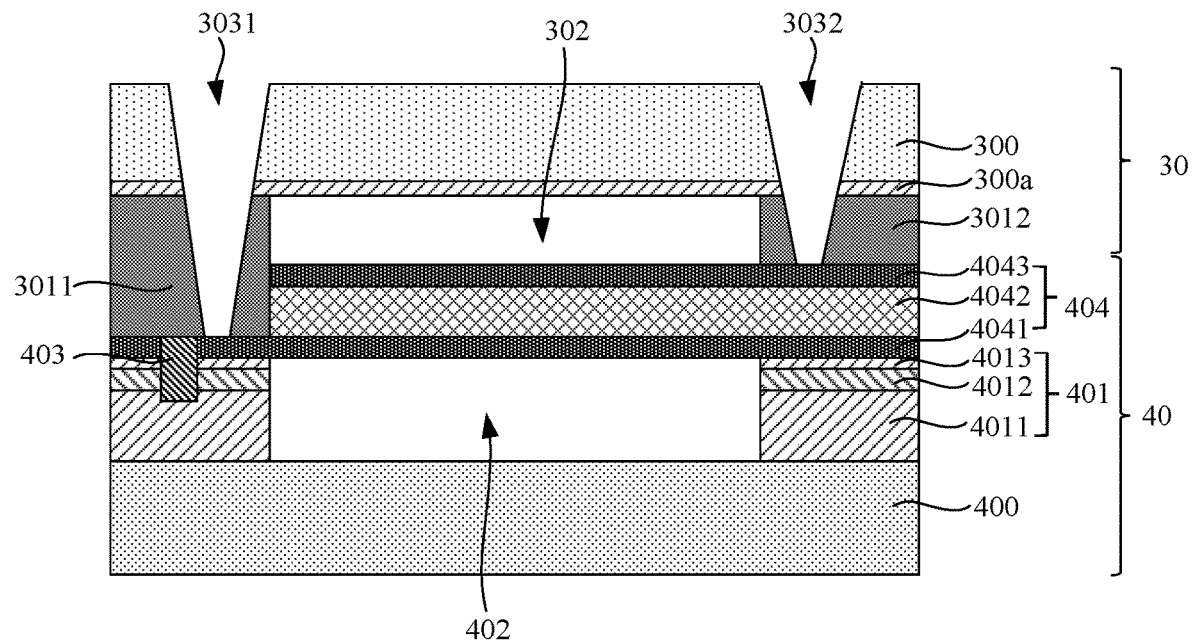

Referring to FIG. 3D, in S4, through a chemical mechanical polishing (CMP) process, the second substrate 300 may be first thinned from the side of the second substrate 300 facing away from the film bulk acoustic resonant structure 404. In one embodiment, the second substrate 300 may be thinned to have a thickness in a range of approximately 60

μm-80 μm. Then, using a through-silicon via (TSV) etching process, a first hole may be formed from the side of the second substrate 300 over the first upper cavity wall 3011 facing away from the film bulk acoustic resonant structure 404. The first hole may penetrate through the etching stop layer 300a and may be connected with the initial opening 301b in the first upper cavity wall 3011, thereby forming a first through-hole 3031 exposing a portion of the first electrode 4041 at the opening 404'.

A second hole may be formed from the side of the second substrate 300 over the second upper cavity wall 3012 facing away from the film bulk acoustic resonant structure 404. The second hole may penetrate through the etching stop layer 300a and may be connected with the initial opening 301b in the second upper cavity wall 3012, thereby forming a second through-hole 3032 exposing a portion of the second electrode 4043. The portion of the first electrode 4041 extending out of the first cavity 402 and exposed by the first through-hole 3031 may refer to the first electrical connection part. The portion of the second electrode 4043 extending out of the first cavity 402 and exposed by the second through-hole 3032 may refer to the second electrical connection part.

Specifically, through exposure, development, and etching processes, the second substrate 300 and the etching stop layer 300a over the first upper cavity wall 3011 may be sequentially etched to form the first through-hole 3031. In the etching process of forming the first through-hole 3031, the initial opening 301b in the first upper cavity wall 3011 may be further trimmed on the sidewall, such that the diameter of the initial opening 301b may become larger and the side wall may be inclined, thereby forming the first through-hole 3031 with wide top and narrow bottom that meets the requirements. Then, through exposure, development, and etching processes, the second substrate 300 and the etching stop layer 300a over the second upper cavity wall 3012 may be sequentially etched to form the second through-hole 3032. In the etching process of forming the second through-hole 3032, the initial opening 301b in the second upper cavity wall 3012 may be further trimmed on the sidewall, such that the diameter of the initial opening 301b may become larger and the side wall may be inclined, thereby forming the second through-hole 3032 with wide top and narrow bottom that meets the requirements.

In certain embodiments, the second through-hole 3032 may be first formed and then the first through-hole 3031 may be formed. The size of the first through-hole 3031 and the second through-hole 3032 may be determined according to the to-be-exposed electrode range and the etching condition. In one embodiment, the opening diameters of the first through-hole 3031 and the second through-hole 3032 may be in a range of approximately 20 μm-70 μm, and the depths of the first through-hole 3031 and the second through-hole 3032 may be in a range of approximately 60 μm-100 μm. In addition, the first through-hole 3031 and the second through-hole 3032 each may include a corresponding initial opening, and an opening located in the second substrate, penetrating-through the second substrate, and connected to the initial opening.

Figure 3E:
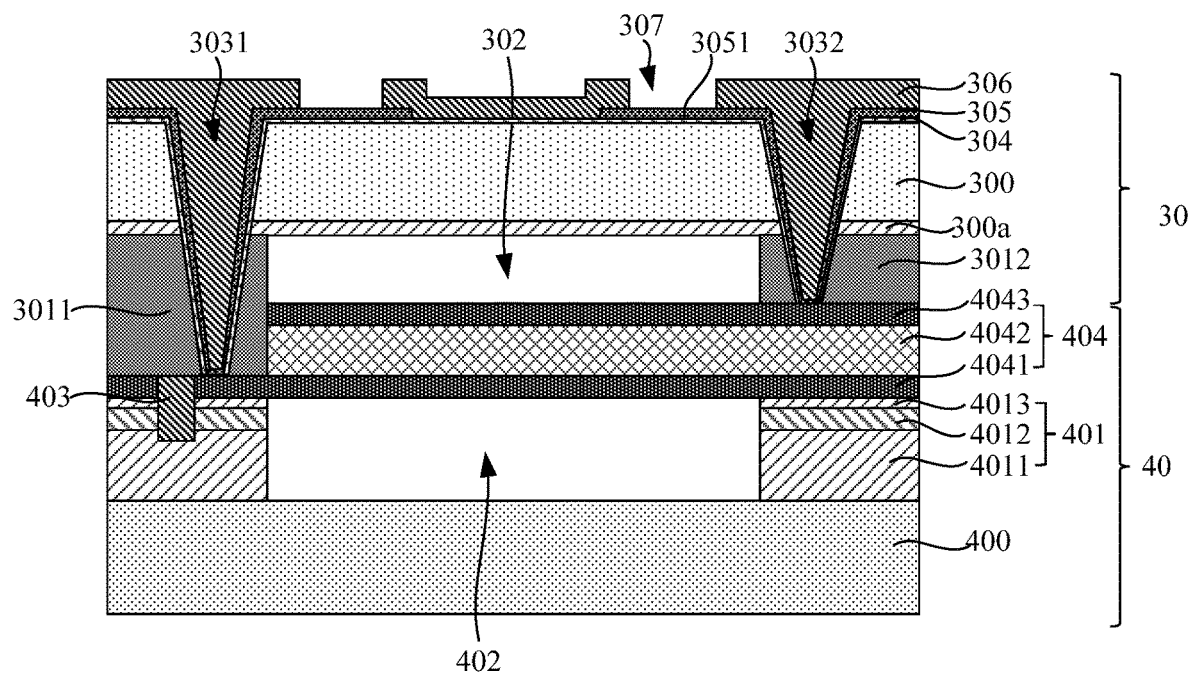

Referring to FIG. 3E, in S5, a diffusion barrier layer 304 may be formed by a deposition process including sputtering, plasma physical vapor deposition, high-density plasma chemical vapor deposition, low-pressure chemical vapor deposition, and atomic layer deposition, etc. Because the diffusion barrier layer 304 is formed by a deposition process, the diffusion barrier layer 304 may not only be formed on the inner surfaces of the first through-hole 3031 and the second through-hole 3032, but also cover the surface of the second substrate 300 facing away from the film bulk acoustic resonant structure 404. The diffusion barrier layer 304 may include a stacked structure, including a nitride layer (not illustrated) for electrically insulating and isolating the subsequently formed conductive interconnection layer 305 from the second substrate 300, and a barrier adhesion layer (not illustrated) stacked on the surface of the nitride layer. The barrier adhesion layer may be made of a material including at least one of Al, Au, Cr, Co, Ni, Cu, Mo, Ti, Ta, W, and Pt.

Plasma physical vapor deposition, high-density plasma chemical vapor deposition, low-pressure chemical vapor deposition, and atomic layer deposition may have desired step coverage, which may prevent the formed diffusion barrier layer 304 from fully filling the first through-hole 3031 and the second through-hole 3032. Then, the diffusion barrier layer 304 at the bottoms of the first through-hole 3031 and the second through-hole 3032 may be removed by etching to expose the first electrode 4041 and the second electrode 4043 at the bottoms of the first through-hole 3031 and the second through-hole 3032. In view of this, the surface of the second substrate 300 around the first through-hole 3031 and the second through-hole 3032 may still be covered with the diffusion barrier layer, to achieve the electrical insulation and isolation between the subsequently formed conductive interconnection layers in the first through-hole 3031 and the second through-hole 3032.

Referring to FIG. 3E, in S5, then, through sputtering, electroplating, plasma physical vapor deposition, high-density plasma chemical vapor deposition, low-pressure chemical vapor deposition, and atomic layer deposition, etc., the through-hole may be metalized, to form a conductive interconnection layer 305. In view of this, the conductive interconnection layer 305 may cover the diffusion barrier layer 304 and the exposed bottom walls of the first through-hole 3031 and the second through-hole 3032. The conductive interconnection layer 305 may be made of a same material as the second electrode and the first electrode, and the deposition process condition and the subsequent etching process condition may the same as the first electrode and the second electrode, to maximize compatibility with the process of S1 and simplify the process. In addition, in certain embodiments, the conductive interconnection layer 305 may be made of a material including at least one of Ti, Ta, W, Mo, Cu, and W. Then, through exposure, development, and etching processes, a portion of the conductive interconnection layer 305 on the surface of the second substrate 300 facing away from the first substrate 400 may be removed, to pattern the conductive interconnection layer 305. The formed patterned conductive interconnection layers 305 may be electrically connected to the second electrode 4043 and the first electrode 4042, respectively.

Referring to FIG. 3E, in S6, through deposition process including sputtering, electroplating, plasma physical vapor deposition, high-density plasma chemical vapor deposition, low-pressure chemical vapor deposition, atomic layer deposition, etc., a passivation layer 306 may be formed in the first through-hole 3031 and the second through-hole 3032, on the conductive interconnection layer 305 on the surface of the second substrate 300 facing away from the first substrate 400, and on the surface of the second substrate 300 exposed by the conductive interconnection layers 305. The deposited passivation layer 306 may have a thickness that is sufficient to fully fill the first through-hole 3031 and the second through-hole 3032.

Optionally, the passivation layer 306 may be made of a same material as the piezoelectric layer 4042, and may be formed by a same deposition process as the piezoelectric layer 4042, which may maximize the process compatibility of the resonant cavity main structure 40, and at the same time, may avoid the problem of temperature drift caused by a passivation layer made of any other material and the problem of introduction of unnecessary stress, thereby improving the resonance performance of the resonator.

Then, through exposure, development, and etching processes, the passivation layer 306 may be patterned to form a contact opening 307. The process conditions for patterning the passivation layer 306 may be the same as the process conditions for patterning the piezoelectric layer 402, which may maximize the process compatibility of the resonant cavity main structure 40. The contact opening 307 may expose a portion of the conductive interconnection layer 305 on the surface of the second substrate 300 facing away from the first substrate 400, to form a conductive contact pad 3051. The conductive contact pad 3051 may include a conductive contact pad electrically connected to the first electrode 4041 and a conductive contact pad electrically connected to the second electrode 4043. In view of this, the passivation layer 306 may fully fill the first through-hole 3031 and the second through-hole 3032, to enhance the mechanical supporting performance of the upper cavity wall 301.

In certain embodiments, the above steps S1 and S2 may be simultaneously performed, or step S2 may be first performed and then step S1 may be performed. In addition, the passivation layer 306 may be made of a conventional passivation material, and such conventional passivation material may include at least one of silicon oxide, silicon nitride, silicon oxynitride, metal nitride, and polymer.

Accordingly, in the disclosed packaging method of the film bulk acoustic resonator, the elastic bonding material layer having the second cavity and the initial opening may be formed on the second substrate, to form the resonator cover. Then, the resonator cover may be directly bonded to the resonant cavity main structure through the elastic bonding material layer on the resonator cover. Then, a hole may be formed by penetrating through the resonator cover, and the hole may be connected with a corresponding initial opening, to form a corresponding through-hole. Then, the conductive interconnection layer covering the inner surface of the through-hole and a portion of the surface of the second substrate may be formed.

Such process may not only have the characteristics of low cost, simple process and high process compatibility with the resonant cavity main structure, but also may not cause the pollution problem of the Au—Au bonding process. More importantly, the process difficulty of forming the through-hole by forming a hole from a side of the second substrate may be reduced. Further, while ensuring the performance of the formed through-hole and the conductive interconnection layer, the process of forming the through-hole and the conductive interconnection layer may be prevented from affecting the performance of the resonator.

In addition, because the elastic bonding material layer is configured to bond the resonator cover and the resonant cavity main structure, due to the elasticity of the elastic bonding material layer, the elastic bonding material layer may tolerate the film bulk acoustic resonant structure having a certain step height difference in the region around the first cavity, which may ensure the reliability and stability of the bonding. Further, because the required main structure on the resonator cover is formed on the second substrate, the influence on the first cavity may be minimized.

Referring to FIG. 3E, the present disclosure also provides a packaging structure of a film bulk acoustic resonator formed by the disclosed packaging method of the film bulk acoustic resonator. The packaging structure of the film bulk acoustic resonator may include a resonant cavity main structure 40 and a resonator cover 30. The resonant cavity main structure 40 may include a first substrate 400, a film bulk acoustic resonant structure 404, and a first cavity 402 sandwiched therebetween. The resonator cover may include a second substrate 300, an elastic bonding material layer 301 that has lost elasticity, a conductive interconnection layer 305, and a patterned passivation layer 306.

The film bulk acoustic resonant structure 404 may be formed on the first substrate 400, and the elastic bonding material layer 301 that has lost elasticity may be sandwiched between the film bulk acoustic resonant structure 404 and the second substrate 300. A second cavity 302 and a corresponding initial opening 301b may be formed in the bonding material layer 301. The second cavity 302 may expose a portion surface of the second substrate 300. The second cavity 302 may be at least partially aligned with the first cavity 402, and the initial opening 301b may expose a corresponding electrical connection part of the film bulk acoustic resonant structure 404.

The first through-hole 3031 and the second through-hole 3032 may be located around the first cavity 402 and the second cavity 302, may penetrate through the resonator cover, and may expose the corresponding electrical connection part of the film bulk acoustic resonant structure 404. The conductive interconnection layer 305 may cover the inner surfaces (including the side wall and the bottom wall) of the first through-hole 3031 and the second through-hole 3032, and may be continuously extended from the side walls of the first through-hole 3031 and the second through-hole 3032 to a portion of the surface of the second substrate 300 facing away from the film bulk acoustic resonant structure 404. In other words, the conductive interconnection layer 305 may be formed on the inner surfaces of the first through-hole 3031 and the second through-hole 3032, and on the surface of the resonator cover around the first through-hole 3031 and the second through-hole 3032. The patterned passivation layer 306 may fully fill the first through-hole 3031 and the second through-hole 3032, and may cover a portion of the conductive interconnection layer 305 on the surface of the second substrate 300 facing away from the film bulk acoustic resonant structure 404.

In one embodiment, the film bulk acoustic resonant structure 404 may include a first electrode 4041, a piezoelectric layer 4042, and a second electrode 4043 that are sequentially stacked over the first substrate 400. The first cavity 402 may be formed between the first substrate 400 and the first electrode 4041, and the first cavity 402 may be enclosed by the lower cavity wall 401. In one embodiment, the lower cavity wall 401 may be a supporting layer (i.e., the first lower cavity wall layer 4011, the second lower cavity wall layer 4012, and the third lower cavity wall layer 4013 in FIG. 3E) made of a material different from the first substrate 400 and the film bulk acoustic resonant structure 404. The first substrate 400 may be bonded to the film bulk acoustic resonant structure 404 through the supporting layer, the first cavity 402 may be formed in the supporting layer, and the elastic bonding material layer 301 that has lost elasticity may be formed over the supporting layer around the first cavity 402.

In certain embodiments, the first cavity 402 may have a groove structure having the entire bottom recessed in the first substrate 400. In view of this, the lower cavity wall 401 may be the first substrate 400 around the groove. Alternatively, the first cavity 402 may have a cavity structure overall protruding on the surface of the first substrate 400. In both cases, the elastic bonding material layer 301 that has lost elasticity may be formed over the first substrate 400 around the first cavity 402.

The film bulk acoustic resonant structure 404 in the present disclosure may include a first electrode 4041 and a second electrode 4043. The first through-hole 3031 may penetrate through the second substrate from the surface of the second substrate facing away from the film bulk acoustic resonant structure 404 to expose a portion of the surface of the first electrode 4041 (i.e., the first electrical connection part). Therefore, the first through-hole 3031 may contain an initial opening 301*b* that exposes the first electrode 4041, and the first through-hole 3031 may be located over the region of the opening 404'. The second through-hole 3032 may penetrate through the second substrate from the surface of the second substrate facing away from the film bulk acoustic resonant structure 404 to expose a portion of the surface of the second electrode 4043 (i.e., the second electrical connection part). Therefore, the second through-hole 3032 may contain a corresponding initial opening 301*b* that exposes the second electrode 4043, and the second through-hole 3032 may be located over a region outside of the opening 404'.

In other words, both the first through-hole 3031 and the second through-hole 3032 may include two parts, one part may be the initial opening in the elastic bonding material layer 301 that has lost elasticity, and the other part may be a hole penetrating through the second substrate. The first through-hole 3031 and the second through-hole 3032 may expose different electrical connection parts of the film bulk acoustic resonant structure 404. In other words, the electrical connection parts of the film bulk acoustic resonant structure 404 may include a first electrical connection part that is exposed by the first through-hole 3031 and includes a portion of the first electrode 4041 extending out of the first cavity, and a second electrical connection part that is exposed by the second through-hole 3032 and includes a portion of the second electrode 4043 extending out of the first cavity.

In one embodiment, the patterned passivation layer 306 covering the surface of the second substrate 300 facing away from the film bulk acoustic resonant structure 404 may contain a contact opening 307. The contact opening 307 may expose the conductive interconnection layer 305 in a corresponding region. The portion of the conductive interconnection layer 305 exposed by the contact opening 307 may form a conductive contact pad 3051. The conductive interconnection layers 305 may be electrically connected to the second electrode 4043 and the first electrode 4041, respectively, for leading out the second electrode 4043 and the first electrode 4041 through corresponding conductive contact pads 3051, respectively.

In one embodiment, the second substrate 300 may include a silicon substrate, e.g., a bare silicon substrate, such that the first through-hole 3031 and the second through-hole 3032 may be formed by a through-silicon via (TSV) process. The elastic bonding material layer 301 that has lost elasticity may be made of a material that is capable of being patterned, being cured under certain conditions, stably adhering to the upper and lower layers, and being elastic to tolerate a certain step height difference during subsequent bonding of wafers. Therefore, the elastic bonding material layer 301 may be made of a light-curable material, a heat-curable material, or a combination of the light-curable material and the heat-curable material. Removing the elasticity of the elastic bonding material layer 301 may include a light illumination, or a heating and cooling process, and may become a dry film.

In one embodiment, the film bulk acoustic resonant structure 404 may contain an opening 404' exposing a portion of the first electrode 4041 on the periphery of the first cavity 402, and a top-view shape of the opening 404' may be semi-annular or closed-loop, such that a stepped film bulk acoustic resonant structure 404 may be formed at the opening 404', and the step height may be uniform and may be marked as H. The thickness of the elastic bonding material layer 301 between the second substrate 300 and the first substrate 400 may be adaptively changed with the step height of the film bulk acoustic resonant structure 404, and at the same time, the surfaces of the second substrate 300 and the first substrate 400 that are opposite to each other may be kept horizontal, which may facilitate to integrate the formed film bulk acoustic resonator product and any other product on a same printed circuit board.

In addition, in certain embodiments, the passivation layer 306 may be made of a same material as the piezoelectric layer 4042, and may be formed by a same deposition process and an etching process as the piezoelectric layer 4042, which may maximize the process compatibility of the first cavity, and at the same time, may avoid the problem of temperature drift caused by a passivation layer made of any other material and the problem of introduction of unnecessary stress, thereby improving the resonance performance of the resonator. The passivation layer 306 may be made of a conventional passivation material, and such conventional passivation material may include at least one of silicon oxide, silicon nitride, silicon oxynitride, metal nitride, and polymer.

In addition, in one embodiment, an alignment mark 403 may be formed in the lower cavity wall 401 for enclosing the first cavity 402 between the first substrate 400 and the first electrode 4041. The alignment mark 403 may penetrate through the film bulk acoustic resonant structure 404 and may be bonded to the elastic bonding material layer 301.

It should be noted that because the packaging structure of the film bulk acoustic resonator in the present disclosure is formed by the disclosed packaging method of the film bulk acoustic resonator, the material, size and any other parameter of each structure may refer to the related content in the above-mentioned packaging method of the film bulk acoustic resonator, which may not be repeated herein.

The packaging structure of the film bulk acoustic resonator in the present disclosure may improve the resonance performance of the resonator, and may be formed by the packaging method of the film bulk acoustic resonator in the present disclosure, which may simplify the process and reduce the cost.

The present disclosure may have following beneficial effects. In the disclosed packaging method of the film bulk acoustic resonator, the elastic bonding material layer having the second cavity and the initial opening may be formed on the second substrate, to form the resonator cover. Then, the resonator cover may be directly bonded to the resonant cavity main structure through the elastic bonding material layer on the resonator cover. Then, a hole may be formed by penetrating through the resonator cover, and the hole may be connected with a corresponding initial opening, to form a corresponding through-hole. Then, the conductive interconnection layer covering the inner surface of the through-hole and a portion of the surface of the second substrate may be formed.

In such process, the initial opening may be first formed (i.e., a portion of the through-hole may be first formed), and then a hole may be formed by penetrating through the second substrate and may be connected with the initial opening, to form a full through-hole. Therefore, the difficulty of forming the through-hole may be reduced. Further, while ensuring the performance of the formed through-hole and the conductive interconnection layer, the process of forming the through-hole and the conductive interconnection layer may be prevented from affecting the performance of the resonator. Such process may have the characteristics of low cost, simple process and high process compatibility with the resonant cavity main structure.

In addition, because when the resonator cover is bonded to the resonant cavity main structure, the main contact region may be the elastic bonding material layer around the second cavity, which may not cause pollution problem in the Au—Au bonding process.

Moreover, because the elastic bonding material layer has a certain elasticity, the thickness of the elastic bonding material layer may be adaptively changed with the step height of the film bulk acoustic resonant structure on the periphery of the first cavity, the elastic bonding material layer may tolerate the film bulk acoustic resonant structure having a certain step height difference in the region around the first cavity. Therefore, when the resonator cover and the resonant cavity main structure are bonded together, not only the surface of the second substrate facing away from the first substrate may not be tilted, but also the step height difference of the film bulk acoustic resonant structure may be complemented, which may ensure the reliability and stability of the bonding. Further, the surface of the second substrate facing away from the first substrate may be kept horizontal, which may provide a planarized process window for forming the through-hole and the conductive interconnection layer, thereby ensuring the performance of the formed conductive interconnection layer.

Further, because the required main structure on the resonator cover is formed on the second substrate, the influence on the first cavity may be minimized.

Furthermore, the passivation layer may be made of a same material as the piezoelectric layer in the film bulk acoustic resonant structure, and may be formed by a same deposition process and an etching process as the piezoelectric layer, which may maximize the process compatibility of the first cavity, and at the same time, may avoid the problem of temperature drift caused by a passivation layer made of any other material and the problem of introduction of unnecessary stress, thereby improving the resonance performance of the resonator. The passivation layer may fully fill the first through-hole and the second through-hole, to enhance the mechanical strength of the resonator cover, to enhance the supporting performance of the side wall of the second cavity, which may prevent the deformation of the second cavity from affecting the resonance performance and reliability of the resonator.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A packaging method of a film bulk acoustic resonator, comprising:
   providing a resonant cavity main structure, wherein the resonant cavity main structure includes a first substrate and a film bulk acoustic resonant structure formed on the first substrate, wherein a first cavity is formed between the first substrate and the film bulk acoustic resonant structure;
   forming a resonator cover by providing a second substrate and forming an elastic bonding material layer on the second substrate, wherein the elastic bonding material layer contains a second cavity and an initial opening on a periphery of the second cavity;
   bonding the resonant cavity main structure and the resonator cover together through the elastic bonding material layer and removing elasticity of the elastic bonding material layer, wherein after the bonding process, the film bulk acoustic resonant structure is sandwiched between the first substrate and the second substrate, the second cavity is at least partially aligned with the first cavity, and the initial opening exposes a corresponding electrical connection part of the film bulk acoustic resonant structure;
   forming a through-hole containing the initial opening and a hole connected with the initial opening and passing through the resonator cover; and
   forming a conductive interconnection layer, wherein the conductive interconnection layer covers a sidewall of the through-hole and a portion of a surface of the resonator cover on a periphery of the through-hole.

2. The packaging method according to claim 1, wherein forming the elastic bonding material layer having the initial opening and the second cavity includes:
   covering an elastic bonding material on the second substrate; and etching the elastic bonding material to simultaneously form the second cavity and the initial opening separated from each other in the elastic bonding material, thereby forming the elastic bonding material layer; or
   covering the elastic bonding material on the second substrate; first forming the second cavity in the elastic bonding material; and then forming the initial opening in the elastic bonding material, thereby forming the elastic bonding material layer; or
   covering the elastic bonding material on the second substrate; first forming the initial opening in the elastic bonding material; and then forming the second cavity in the elastic bonding material, thereby forming the elastic bonding material layer.

3. The packaging method according to claim 1, wherein:
   the initial opening penetrates through the elastic bonding material layer and has a depth same as the second cavity on the second substrate; or
   the initial opening is formed in the elastic bonding material layer and has a depth less than an entire thickness of the elastic bonding material layer on the second substrate.

4. The packaging method according to claim 1, wherein:
   the film bulk acoustic resonant structure includes a first electrode adjacent to the first substrate, a piezoelectric layer on the first electrode, and a second electrode on the piezoelectric layer, and
   the electrical connection part includes a first electrical connection part including a portion of the first electrode extending out of the first cavity, and a second electrical connection part including a portion of the second electrode extending out of the first cavity.

5. The packaging method according to claim 1, wherein:
the film bulk acoustic resonant structure has an opening that exposes part or all of the electrical connection part in a region on the periphery of the first cavity; and
when the resonant cavity main structure and the resonator cover are bonded together, a thickness of the elastic bonding material layer varies to adapt to a step height at the opening.

6. The packaging method according to claim 1, wherein:
the elastic bonding material layer is made of one or more of a light-curable material and a heat-curable material, and
removing the elasticity includes: a light illumination, or a heating and cooling process.

7. The packaging method according to claim 1, wherein forming the elastic bonding material layer having the second cavity and the initial opening on the second substrate includes:
covering an etching stop layer on the second substrate;
coating a fluidic dry photoresist material or pressing a solid dry material on the second substrate, to form an elastic bonding material; and
patterning the elastic bonding material to form the second cavity and the initial opening.

8. The packaging method according to claim 1, after bonding the resonant cavity main structure and the resonator cover together and before forming the through-hole, further including:
thinning the second substrate.

9. The packaging method according to claim 1, after forming the conductive interconnection layer, further including:
forming a patterned passivation layer, wherein:
the patterned passivation layer fully fills the through-hole and exposes a portion of the conductive interconnection layer on a surface of the resonator cover on the periphery of the through-hole, and
the exposed conductive interconnection layer forms a conductive contact pad.

10. The packaging method according to claim 9, wherein:
the passivation layer is made of a same material as the piezoelectric layer, or
the passivation layer is made of at least one of silicon oxide, silicon nitride, silicon oxynitride, metal nitride, and polymer.

11. The packaging method according to claim 1, wherein providing the resonant cavity main structure includes:
providing a carrier substrate, and sequentially forming a film layer for forming the film bulk acoustic resonant structure and a supporting layer on the carrier substrate;
etching the supporting layer to form a cavity in the supporting layer;
providing the first substrate, and bonding the first substrate to the supporting layer; and
removing the carrier substrate to form the resonant cavity main structure.

12. The packaging method according to claim 11, before forming the supporting layer on the film layer for forming the film bulk acoustic resonant structure, or after removing the carrier substrate, further including:
patterning the film layer to form the resonant cavity main structure.

13. The packaging method according to claim 1, wherein providing the resonant cavity main structure includes:
providing the first substrate, and forming a sacrificial layer on a portion of the first substrate;
forming the film bulk acoustic resonant structure over the sacrificial layer and the first substrate; and
removing the sacrificial layer to form the first cavity.

14. The packaging method according to claim 13, wherein forming the sacrificial layer on the portion of the first substrate includes:
etching the first substrate to form a groove in the first substrate, and forming the sacrificial layer to fill the groove; or
covering the sacrificial layer on the first substrate, and patterning the sacrificial layer to enable the sacrificial layer to be protruded on the portion of the first substrate.

* * * * *